(12) United States Patent
Watanabe

(10) Patent No.: US 9,123,621 B2
(45) Date of Patent: Sep. 1, 2015

(54) SOLID-STATE IMAGE SENSOR, METHOD OF MANUFACTURING THE SAME, AND CAMERA WITH PLURAL SUBSTRATES

(71) Applicant: CANON KABUSHIKI KAISHA, Tokyo (JP)

(72) Inventor: Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 13/828,179

(22) Filed: Mar. 14, 2013

(65) Prior Publication Data

US 2013/0277534 A1 Oct. 24, 2013

(30) Foreign Application Priority Data

Apr. 23, 2012 (JP) ................... 2012-098239

(51) Int. Cl.
*H01L 27/148* (2006.01)
*H01L 31/18* (2006.01)
*H01L 27/146* (2006.01)

(52) U.S. Cl.
CPC .... *H01L 27/14806* (2013.01); *H01L 27/14634* (2013.01); *H01L 31/18* (2013.01); *H01L 27/14609* (2013.01)

(58) Field of Classification Search
USPC ........ 250/208.1, 208.2, 214 A, 214.1, 214 R; 257/431; 438/108
See application file for complete search history.

(56) References Cited

U.S. PATENT DOCUMENTS

| | | | |
|---|---|---|---|
| 7,935,995 B2 | 5/2011 | Watanabe et al. | 257/292 |
| 7,982,789 B2 | 7/2011 | Watanabe et al. | 348/308 |
| 8,115,847 B2 | 2/2012 | Watanabe | 348/308 |
| 8,466,532 B2 | 6/2013 | Watanabe | 257/435 |
| 2007/0098389 A1* | 5/2007 | Takahashi | 396/121 |
| 2008/0042046 A1* | 2/2008 | Mabuchi | 250/208.1 |
| 2009/0303365 A1 | 12/2009 | Watanabe | 348/302 |
| 2010/0214464 A1 | 8/2010 | Watanabe | 348/311 |
| 2010/0238334 A1 | 9/2010 | Takahashi | 348/305 |
| 2011/0050969 A1 | 3/2011 | Nishihara | 348/296 |
| 2011/0234868 A1 | 9/2011 | Yamashita et al. | 348/294 |
| 2011/0242387 A1 | 10/2011 | Watanabe | 348/308 |
| 2012/0064827 A1* | 3/2012 | Kim et al. | 455/41.1 |

FOREIGN PATENT DOCUMENTS

| | | |
|---|---|---|
| JP | 2008-085755 A | 4/2008 |
| JP | 2010-219339 A | 9/2010 |
| JP | 2011-071958 A | 4/2011 |
| JP | 2012-015275 A | 1/2012 |
| WO | WO 2012/001923 A1 | 1/2012 |

* cited by examiner

*Primary Examiner* — Francis M Legasse, Jr.

(74) *Attorney, Agent, or Firm* — Fitzpatrick, Cella, Harper & Scinto

(57) ABSTRACT

A solid-state image sensor may include a first substrate and a second substrate that are combined with each other. The first substrate may include a photoelectric conversion portion, a holding portion which holds a charge generated in the photoelectric conversion portion, a transfer portion which transfers the charge generated in the photoelectric conversion portion to the holding portion, and a first electrode connected to the holding portion. The second substrate may include a second electrode and an amplifier portion which is connected to the second electrode and amplifies a signal in the holding portion. The holding portion and the amplifier portion may be electrically connected to each other by a capacitance formed by the first electrode and the second electrode.

10 Claims, 3 Drawing Sheets

SOLID-STATE IMAGE SENSOR, METHOD OF MANUFACTURING THE SAME, AND CAMERA WITH PLURAL SUBSTRATES

BACKGROUND OF THE INVENTION

1. Field of the Invention

The present invention relates to a solid-state image sensor, a method of manufacturing the same, and a camera.

2. Description of the Related Art

With the tendency toward increasing semiconductor chip size and increasing manufacturing process complexity, it has become possible to use a technique of separately manufacturing a plurality of substrates and connecting them by using bumps.

FIG. 2 in Japanese Patent Laid-Open No. 2008-85755 discloses a structure in which a pixel cell 16 and a reception circuit 17 are electrically connected to each other by forming a capacitance by using an electrode for outputting a signal from the pixel cell 16 to the reception circuit 17 and an electrode for inputting a signal from the pixel cell 16 to the reception circuit 17. In this case, the pixel cell 16 includes a photoelectric conversion portion, a transfer portion for transferring the charge generated in the photoelectric conversion portion, and an amplifier portion for amplifying a signal corresponding to the amount of charges. As disclosed in FIGS. 6 to 10 in Japanese Patent Laid-Open No. 2008-85755, the capacitance formed by the two electrodes may be disposed after the pixel cell 16 (after an inverter, multiplexer, or the like).

According to Japanese Patent Laid-Open No. 2008-85755, a solid-state image sensor is formed by combining a substrate (solid-state image sensor element 11) including the pixel cell 16 with a substrate (signal processing element 12) including the reception circuit 17. Photoelectric conversion portions, transfer portions, and amplifier portions are arranged on the substrate including the pixel cell 16, and hence it is difficult to increase the aperture ratio of each pixel while ensuring an area for each photoelectric conversion portion.

SUMMARY OF THE INVENTION

The present invention has been made in consideration of the above problem and has as its object to provide a technique advantageous to higher pixel density solid-state image sensors.

One of the aspects of the present invention provides a solid-state image sensor comprising a first substrate and a second substrate combined with each other, the first substrate comprising a photoelectric conversion portion, a holding portion which holds a charge generated in the photoelectric conversion portion, a transfer portion which transfers the charge generated in the photoelectric conversion portion to the holding portion, and a first electrode connected to the holding portion, and the second substrate comprising a second electrode and an amplifier portion which is connected to the second electrode and amplifies a signal in the holding portion, wherein the holding portion and the amplifier portion are electrically connected to each other by a capacitance formed by the first electrode and the second electrode.

Further features of the present invention will become apparent from the following description of exemplary embodiments with reference to the attached drawings.

DESCRIPTION OF THE EMBODIMENTS

First Embodiment

Figure 1A:
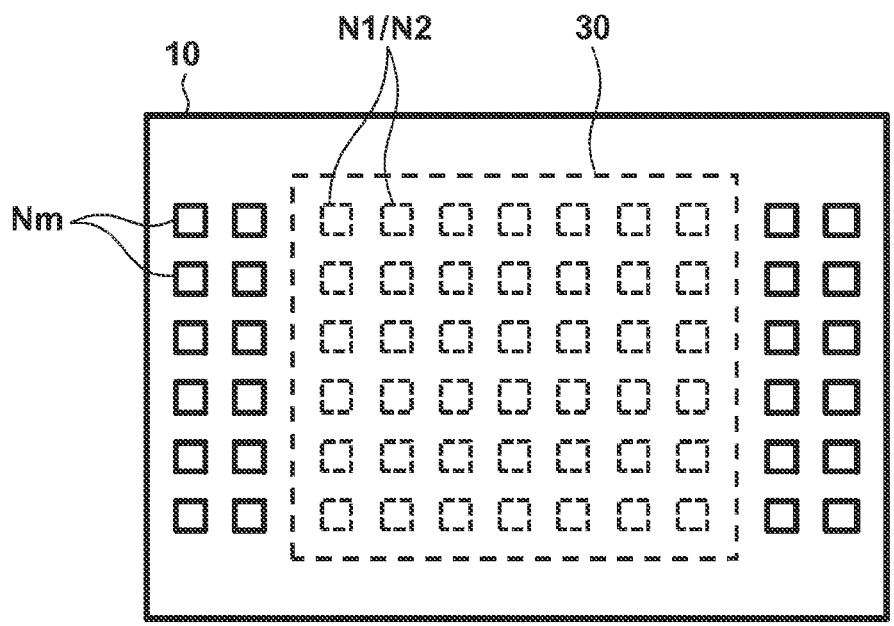
FIGS. 1A and 1B are views for explaining an example of the arrangement of a solid-state image sensor according to the first embodiment.
Figure 1B:
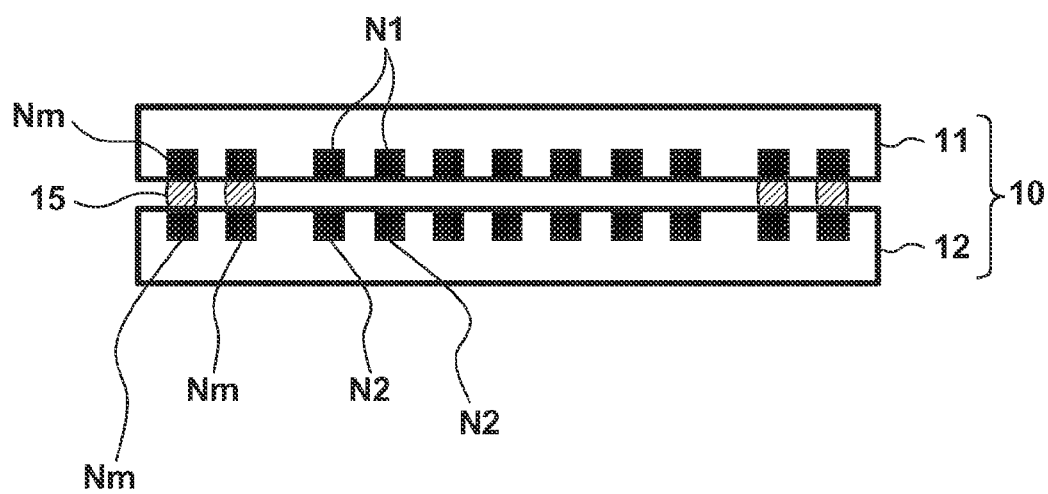
Figure 2:
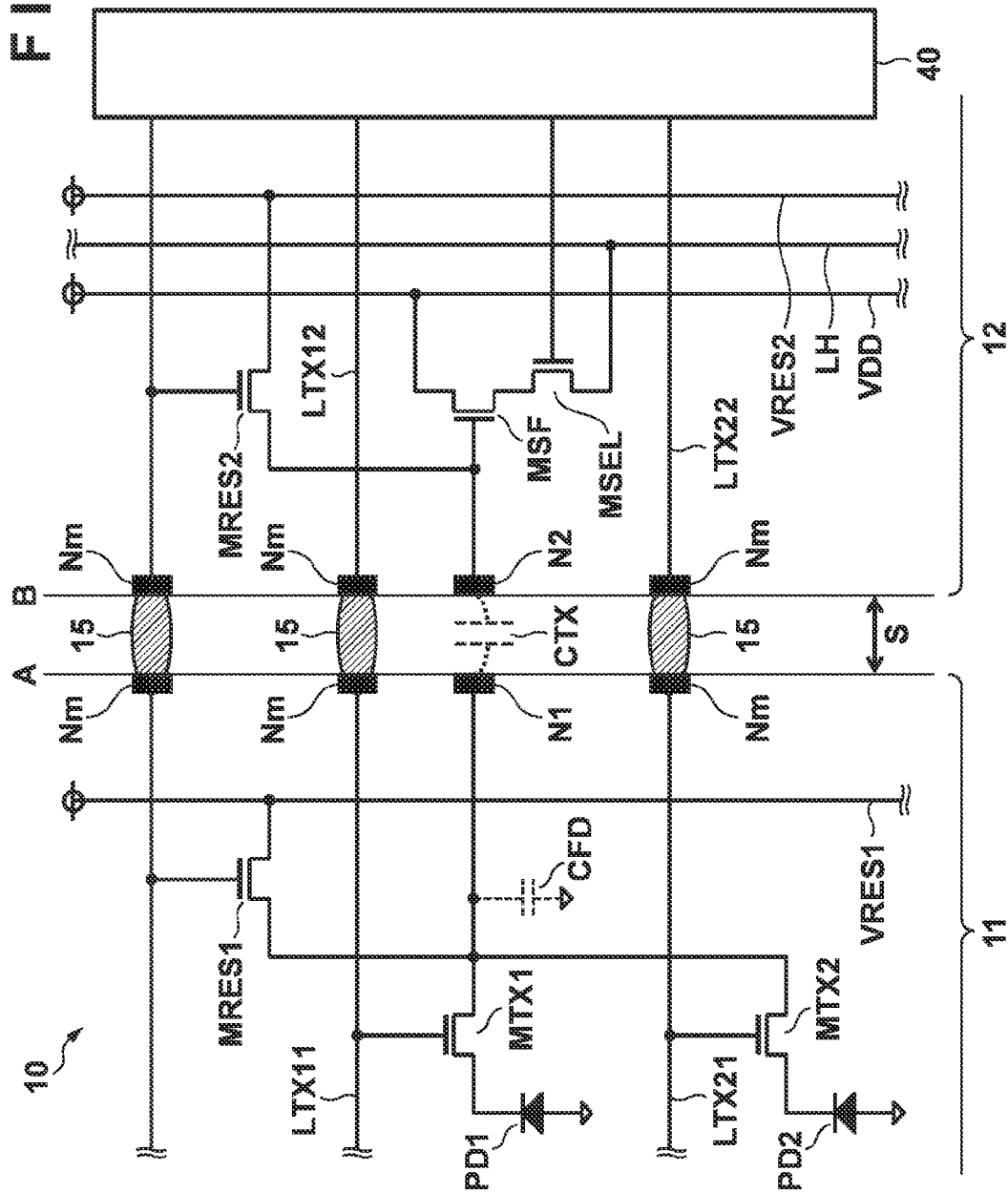
FIG. 2 is a circuit diagram for explaining an example of the circuit arrangement of the solid-state image sensor according to the first embodiment.

A solid-state image sensor 10 according to the first embodiment will be described with reference to FIGS. 1A, 1B, and 2. FIGS. 1A and 1B show the solid-state image sensor 10 formed by combining a first substrate 11 with a second substrate 12. FIG. 1A is a plan view schematically showing the solid-state image sensor 10. FIG. 1B is a side view schematically showing the solid-state image sensor 10. Electrodes Nm on the first substrate 11 are in contact with electrodes Nm on the second substrate 12 through, for example, electrical conductors (microbumps 15). The electrodes Nm on the first substrate 11 may also be in direct contact with the electrodes Nm on the second substrate 12 as long as they are electrically connected to each other. In addition, an electrode N1 on the first substrate 11 is electrically connected to an electrode N2 on the second substrate 12 by the capacitance formed by the two electrodes. According to another aspect, a signal is transmitted between the electrode N1 and the electrode N2 by capacitive coupling. An image sensor unit 30 in which a plurality of pixel are arranged can use such capacitive connection. Although the first substrate 11 and the second substrate 12 are combined with each other in this manner, the solid-state image sensor 10 may further include a member for aiding the combining or an infill having an adherence property between the first substrate 11 and the second substrate 12. The circuit arrangement of the solid-state image sensor 10 will be described below with reference to FIG. 2.

The first substrate 11 includes photoelectric conversion portions PD1 and PD2, an FD capacitance CFD (floating diffusion capacitance) as a holding portion, and transfer transistors MTX1 and MTX2 as transfer portions, and the first electrode N1. As the photoelectric conversion portions PD1 and PD2, photodiodes are used in this case. The FD capacitance CFD holds the charge generated in at least one of the photoelectric conversion portions PD1 and PD2. The transfer transistor MTX1 transfers the charge generated in the photoelectric conversion portion PD1 to the FD capacitance CFD. The transfer transistor MTX2 transfers the charge generated in the photoelectric conversion portion PD2 to the FD capacitance CFD. In this case, the transfer transistors MTX1 and MTX2 share the FD capacitance CFD. The first electrode N1 is connected to the FD capacitance CFD.

The second substrate 12 includes the second electrode N2, an amplifier transistor MSF as an amplifier portion, and a vertical scanning circuit 40 for driving a solid-state image sensor 20. The amplifier transistor MSF is connected to the second electrode N2 and amplifies the signal in the holding portion. In this case, the FD capacitance CFD is electrically connected to the amplifier transistor MSF by causing the first electrode N1 and the second electrode N2 to form a capacitance CTX.

The first substrate 11 includes a line LTX11 (first line) for transmitting a control signal TX1 for controlling the transfer transistor MTX1. The second substrate 12 includes a line LTX12 (second line) for transmitting a control signal TX1. The electrode Nm connected to the line LTX11 is in contact with the electrode Nm connected to the line LTX12 through, for example, a microbump 15. Likewise, the first substrate 11 includes a line LTX21 for transmitting a control signal TX2 for controlling the transfer transistor MTX2. The second substrate 12 includes a line LTX22 for transmitting the control signal TX2. The electrode Nm connected to the line LTX21 is in contact with the electrode Nm connected to the line LTX22 through, for example, the microbump 15. For example, the vertical scanning circuit 40 can output the control signals TX1 and TX2.

The first substrate 11 can include a reset transistor MRES1 (first reset portion) for resetting the potential of the FD capacitance CFD. The second substrate 12 can include a reset transistor MRES2 (second reset portion) for resetting the potential of the gate (input) of the amplifier transistor MSF. Since the FD capacitance CFD is connected to the gate of the amplifier transistor MSF via a capacitance, the two reset transistors MRES1 and MRES2 are preferably provided to reset the potentials of the respective nodes. In this case, a power line for supplying power VRES1 to the reset transistor MRES1 and a power line for supplying power VRES2 to the reset transistor MRES2 are separately disposed. In this case, since the capacitance CTX transfers a variation (AC component) in the potential of the FD capacitance CFD to the amplifier transistor MSF, no problem arises even if the potential of the FD capacitance CFD differs from the potential of the gate of the amplifier transistor MSF.

When, for example, the control signal TX1 supplied to the gate of the transfer transistor MTX1 is activated, the transfer transistor MTX1 transfers, to the FD capacitance CFD, the charge generated and accumulated by the photoelectric conversion portion PD1 upon reception of light. In this case, as described above, the capacitance CTX transfers a variation (AC component) in the potential of the FD capacitance CFD to the amplifier transistor MSF. The amount of current flowing in the amplifier transistor MSF can change in accordance with the variation in charge amount transferred to the FD capacitance CFD. Therefore, the solid-state image sensor 10 is preferably designed such that the capacitance value of the capacitance CTX becomes large. More specifically, an insulator having a high dielectric constant is preferably disposed between the first electrode N1 and the second electrode N2 (gap S). When a control signal SEL supplied to the gate of a selection transistor MSEL is activated, the selection transistor MSEL can output a pixel signal corresponding to the amount of current in the amplifier transistor MSF to a column signal line LH. Thereafter, a horizontal scanning circuit (not shown) on the second substrate 12 can process the pixel signal as an image signal. In this case, the amplifier transistor MSF is connected to the column signal line LH to which a constant current is supplied from a current source (not shown). That is, a source follower circuit can be formed. With this arrangement, the potential of the source of the amplifier transistor MSF can change in accordance with the amount of charges transferred to the FD capacitance CFD.

The circuit arrangement used in this case uses the selection transistors MSEL to speed up readout operation of pixel signals and increase the dynamic range. However, an arrangement without any selection transistor MSEL may be used. In addition, in this case, one pixel signal readout portion (including the amplifier transistor MSF and the selection transistor MSEL) is disposed for the two photoelectric conversion portions PD1 and PD2. However, this embodiment is not limited to this arrangement. For example, one readout portion may be disposed for one photoelectric conversion portion or one readout portion may be disposed for three or more photoelectric conversion portions.

A method of manufacturing the solid-state image sensor 10 includes a connection step of electrically connecting the FD capacitance CFD to the amplifier transistor MSF by combining the first and second substrates 11 and 12 with each other and making the first electrode N1 and the second electrode N2 form a capacitance. In this case, as shown in FIG. 2, the surface of the first substrate 11 on which the first electrodes N1 are arranged is defined as a surface A, and the surface of the second substrate 12 on which the second electrodes N2 are arranged is defined as a surface B. It is possible to perform this connection step after the deposition of an insulator on an area where each capacitance CTX is to be formed on at least one of the surfaces A and B. Alternatively, it is possible to perform the connection step by bonding the surfaces A and B to each other by using an insulator having adherence property. As an insulator having adherence property, for example, a member having an OH group is used. For example, silicon oxide can be used. Alternatively, a member having a high dielectric constant such as hafnium oxide can be used.

As described above, according to this embodiment, since the first substrate 11 and the second substrate 12 are separately manufactured, it is possible to manufacture each substrate by selecting a suitable semiconductor manufacturing process. For example, in manufacturing the first substrate 11 including the photoelectric conversion portions PD1 and the like, it is possible to increase the aperture ratio of each pixel while ensuring an area for each photoelectric conversion portion. This is advantageous to an increase in the pixel density of the solid-state image sensor 10. In addition, with regard to the first substrate 11, it is possible to pay attention to design and manufacture for the suppression of noise. This is advantageous to the design of the image sensor unit 30. On the other hand, in manufacturing the second substrate 12 including the amplifier transistors MSF and buffer circuits (not shown), it is possible to pay attention to design with priority on operation speed and select a manufacturing process advantageous to the design. In manufacturing the second substrate 12 of the first and second substrates 11 and 12, it is possible to use a silicide process. For example, a metal for forming silicide can be a cause for noise such as a white defect in a photoelectric conversion portion. For this reason, it is possible to use no silicide process in manufacturing the first substrate 11. On the other hand, it is possible to increase the operation speed of a solid-state image sensor, while suppressing a deterioration in image quality, by using a silicide process in manufacturing the second substrate 12. When connecting the two substrates by using microbumps, a positional shift upon bonding or the like can cause an electric short failure between adjacent pixels. According to this embodiment, however, since the first and second substrates 11 and 12 are bonded to each other through an insulator, it is possible to reduce the occurrence of electric short failures and the like. This can improve the yield.

Second Embodiment

Figure 3:
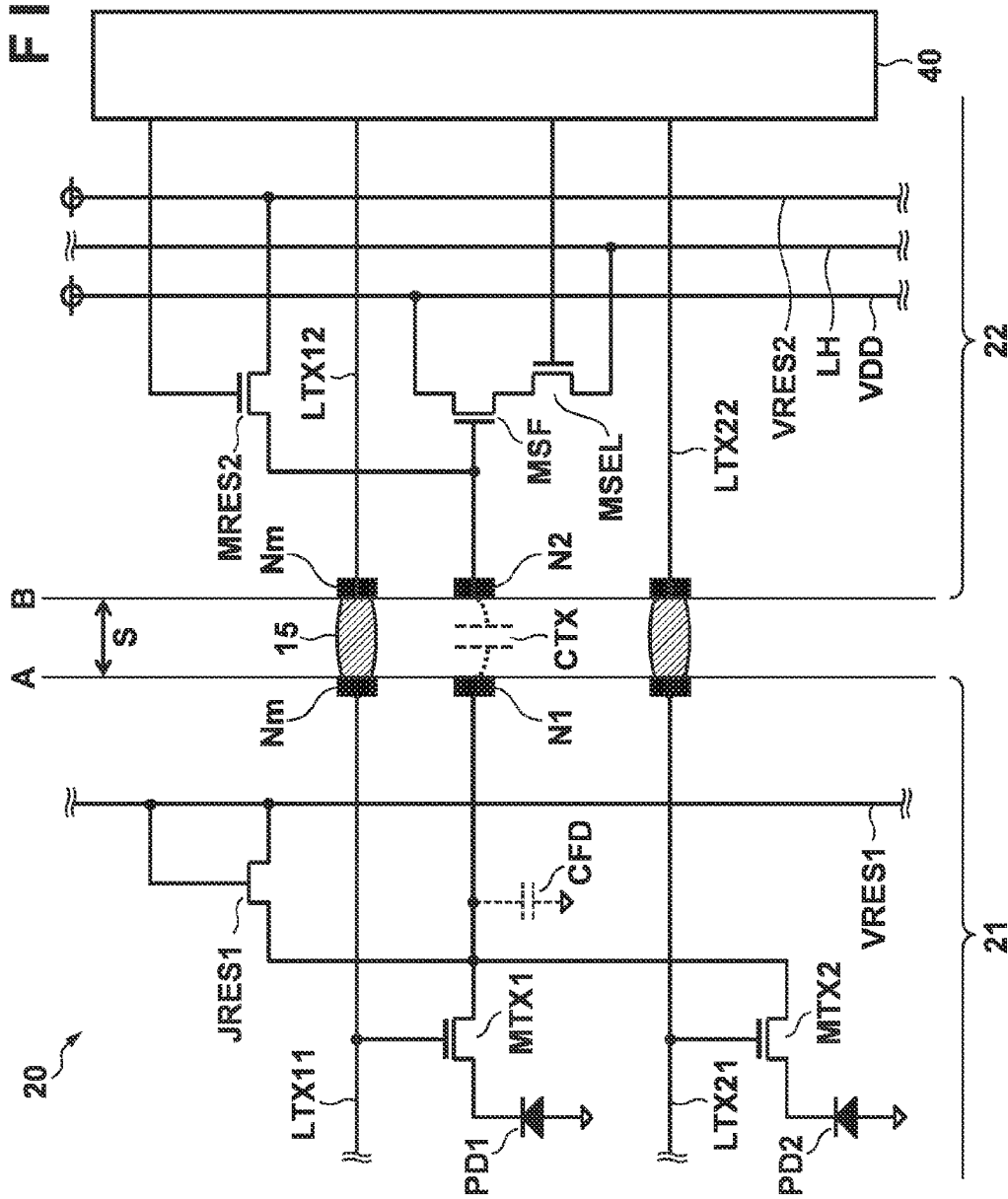
FIG. 3 is a circuit diagram for explaining an example of the circuit arrangement of a solid-state image sensor according to the second embodiment.

A solid-state image sensor 20 according to the second embodiment will be described with reference to FIG. 3. As in the first embodiment, the solid-state image sensor 20 is formed by combining a first substrate 21 with a second substrate 22. The second embodiment differs from the first embodiment in that a transistor JRES1 (J-FET) is used as a transistor for resetting the potential of an FD capacitance CFD instead of the transistor MRES1 (MOSFET). This makes it possible to use MOSFETs for only transfer transistors MTX1 and MTX2 on the first substrate 21. Therefore, MOSFET design on the first substrate 21 is advantageous in terms of being able to be specified to design for the transfer of the charge generated in each photoelectric conversion portion. For example, the transfer transistors MTX1 and MTX2 are preferably designed, based on the relationship between resistance values in the conduction states of the transistors and the capacitance values of photoelectric conversion portions PD1 and PD2, such that the time required to read out pixel signals falls below a target value. Therefore, for example, the widths and lengths of the gates of the transfer transistors MTX1 and MTX2, the thicknesses of gate insulating films, materials, and the like may be designed in accordance with the specifications of the solid-state image sensor 20. As described above, this embodiment is advantageous to an increase in the pixel density of the solid-state image sensor 20. In the embodiment, the gate and drain of the reset transistor JRES1 (J-FET) are short-circuited. This can reduce the number of lines required to drive the reset transistors. In the first embodiment described above, likewise, the gate and drain of each reset transistor may be short-circuited, and it is possible to reduce the number of lines required to drive the reset transistors.

Although the two embodiments have been described above, the present invention is not limited to them. Obviously, it is possible to change the object, state, application, function, and other specifications of the embodiments, and to implement the present invention by using other embodiments. Each sensor portion is formed as, for example, a CMOS image sensor. Alternatively, other any types of sensors can be used.

In addition, the above embodiments have exemplified the solid-state image sensor included in a camera. Note that the concept of the camera includes not only an apparatus mainly designed to perform imaging but also an apparatus including an imaging function as an auxiliary function (for example, a personal computer or a portable terminal). A camera can include the solid-state image sensor according to the present invention, which has been exemplified as each embodiment described above, and a processor which processes the signal output from the solid-state image sensor. This processor can include an A/D converter and a processor which processes the digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-098239, filed Apr. 23, 2012, which is hereby incorporated by reference herein in its entirety.

What is claimed is:

1. A solid-state image sensor comprising a plurality of pixels and a signal line to which signals from the plurality of pixels are read out, and having a structure which includes a first substrate and a second substrate combined with each other, wherein
    each of the plurality of pixels includes a photoelectric conversion portion, a holding portion which holds a charge generated in the photoelectric conversion portion, a transfer portion which transfers the charge generated in the photoelectric conversion portion to the holding portion, a first electrode connected to the holding portion, a second electrode, and an amplifier portion which is connected to the second electrode and amplifies a signal in the holding portion,
    the photoelectric conversion portion, the holding portion and the transfer portion are provided in the first substrate,
    the amplifier portion is provided in the second substrate, and
    the holding portion and the amplifier portion are electrically connected to each other by a capacitance formed by the first electrode and the second electrode.

2. The sensor according to claim 1, wherein the first substrate includes a first line which transmits a control signal for controlling the transfer portion, and the second substrate includes a second line which transmits the control signal, and
    an electrode connected to the first line and an electrode connected to the second line are in contact with each other directly or through an electrical conductor.

3. The sensor according to claim 1, wherein an insulator is disposed between the first electrode and the second electrode.

4. The sensor according to claim 1, wherein the first substrate comprises a first reset transistor which resets a potential of the holding portion, and the second substrate comprises a second reset transistor which resets a potential of an input of the amplifier portion.

5. A camera comprising a solid-state image sensor defined in claim 1.

6. The sensor according to claim 1, wherein the first substrate includes a third line which transmits a driving signal for driving the plurality of pixels, and the second substrate includes a fourth line which transmits the driving signal, and
    an electrode connected to the third line and an electrode connected to the fourth line are in contact with each other directly or through an electrical conductor.

7. The sensor according to claim 4, wherein on the first substrate, the transfer portion is composed of a MOSFET and the first reset transistor is composed of a J-FET.

8. A solid-state image sensor comprising a plurality of pixels and a signal line to which signals from the plurality of pixels are read out, and having a structure which includes a first substrate and a second substrate combined with each other, wherein
    each of the plurality of pixels includes a photoelectric conversion portion, a holding portion which holds a charge generated in the photoelectric conversion portion, a transfer portion which transfers the charge generated in the photoelectric conversion portion to the holding portion, a first electrode connected to the holding portion, a second electrode, and an amplifier portion which is connected to the second electrode and amplifies a signal in the holding portion,
    the photoelectric conversion portion, the holding portion and the transfer portion are provided in the first substrate,
    the amplifier portion is provided in the second substrate, and
    a signal based on the charge is transferred via capacitive coupling between the first electrode and the second electrode.

9. A method of manufacturing a solid-state image sensor, the solid-state image sensor comprising a plurality of pixels and a signal line to which signals from the plurality of pixels are read out, and having a structure which includes a first substrate and a second substrate, wherein
    each of the plurality of pixels includes a photoelectric conversion portion, a holding portion which holds a charge generated in the photoelectric conversion portion, a transfer portion which transfers the charge generated in the photoelectric conversion portion to the holding portion, a first electrode connected to the holding portion, a second electrode, and an amplifier portion which is connected to the second electrode and amplifies a signal in the holding portion, the photoelectric conversion portion, the holding portion and the transfer portion are provided in the first substrate, the amplifier portion is provided in the second substrate, and the method comprising a connection step of electrically connecting the holding portion to the amplifier portion by combining the first substrate with the second substrate and making the first electrode and the second electrode form a capacitance.

10. The method according to claim 9, wherein the connection step is performed after an insulator is deposited on at least one of a surface of the first substrate on which the first electrode is disposed and a surface of the second substrate on which the second electrode is disposed.

* * * * *